United States Patent
Chen et al.

(10) Patent No.: US 6,482,700 B2
(45) Date of Patent: Nov. 19, 2002

(54) SPLIT GATE FIELD EFFECT TRANSISTOR (FET) DEVICE WITH ENHANCED ELECTRODE REGISTRATION AND METHOD FOR FABRICATION THEREOF

(75) Inventors: Han-Ping Chen, Hsin-Chu (TW); Hung-Cheng Sung, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 16 days.

(21) Appl. No.: 09/725,984

(22) Filed: Nov. 29, 2000

(65) Prior Publication Data

US 2002/0064910 A1 May 30, 2002

(51) Int. Cl.⁷ ........................................... H01L 21/8232
(52) U.S. Cl. ....................................... 438/267; 438/593
(58) Field of Search .................................. 438/267, 593, 438/FOR 203, FOR 212, 265

(56) References Cited

U.S. PATENT DOCUMENTS

| | | | | |
|---|---|---|---|---|
| 5,550,073 A | * | 8/1996 | Hong | |
| 5,614,429 A | * | 3/1997 | Shin et al. | |
| 5,674,768 A | * | 10/1997 | Chang et al. | |
| 5,940,706 A | | 8/1999 | Sung et al. | |
| 5,989,960 A | * | 11/1999 | Fukase | |
| 6,017,795 A | | 1/2000 | Hsieh et al. | |
| 6,261,907 B1 | * | 7/2001 | Chang | |

* cited by examiner

*Primary Examiner*—Wael Fahmy
*Assistant Examiner*—Joannie Adelle Garcia
(74) *Attorney, Agent, or Firm*—Tung & Associates

(57) ABSTRACT

Within a method for fabricating a split gate field effect transistor (FET) within a semiconductor integrated circuit microelectronic fabrication there is employed a patterned mask layer as an etch mask layer for forming from a blanket floating gate electrode material layer a floating gate electrode. At least a portion of the patterned mask layer is then laterally etched to completely expose an edge of the floating gate electrode prior to forming over the floating gate electrode and the edge of the floating gate electrode an inter-gate electrode dielectric layer having formed thereupon a control gate electrode. The method contemplates a split gate field effect transistor (FET) device fabricated in accord with the method. The resulting split gate field effect transistor (FET) device has an enhanced control gate electrode to floating gate electrode registration.

8 Claims, 2 Drawing Sheets

SPLIT GATE FIELD EFFECT TRANSISTOR (FET) DEVICE WITH ENHANCED ELECTRODE REGISTRATION AND METHOD FOR FABRICATION THEREOF

BACKGROUND OF THE INVENTION

1. Field of the Invention

The present invention relates generally to split gate field effect transistor (FET) devices, as employed within semiconductor integrated circuit microelectronic fabrications. More particularly, the present invention relates to split gate field effect transistor (FET) devices with enhanced properties, as employed within semiconductor integrated circuit microelectronic fabrications.

2. Description of the Related Art

In addition to conventional semiconductor integrated circuit microelectronic fabrications having formed therein conventional field effect transistor (FET) devices and conventional bipolar junction transistor (BJT) devices whose transient operation provides for data storage and transduction capabilities within the conventional semiconductor integrated circuit microelectronic fabrications, there also exists within the art of semiconductor integrated circuit microelectronic fabrication non-volatile semiconductor integrated circuit microelectronic fabrications, and in particular non-volatile semiconductor integrated circuit microelectronic memory fabrications, such as but not limited to electrically erasable programable read only memory (EEPROM) non-volatile semiconductor integrated circuit microelectronic memory fabrications, whose data storage and transduction capabilities are not predicated upon transient operation.

Although non-volatile semiconductor integrated circuit microelectronic memory fabrications, such as but not limited to electrical erasable programmable read only memory (EEPROM) non-volatile semiconductor integrated circuit microelectronic memory fabrications, may be fabricated while employing any of several semiconductor integrated circuit microelectronic devices, a particularly common semiconductor integrated circuit microelectronic device employed within an electrically erasable programmable read only memory (EEPROM) non-volatile semiconductor integrated circuit microelectronic memory fabrication is a split gate field effect transistor (FET) device.

A split gate field effect transistor (FET) device is in part analogous in structure and operation with a conventional field effect transistor (FET) device insofar as a split gate field effect transistor (FET) device also comprises formed within a semiconductor substrate a channel region defined by a pair of source/drain regions also formed within the semiconductor substrate, wherein at least the channel region of the semiconductor substrate has formed thereupon a gate dielectric layer which separates a gate electrode from the channel region of the semiconductor substrate, but a split gate field effect transistor (FET) device is nonetheless distinguished from a conventional field effect transistor (FET) device by employing rather than a single gate electrode positioned upon the gate dielectric layer and completely covering the channel region of the semiconductor substrate: (1) a floating gate electrode positioned upon the gate dielectric layer and covering over only a portion of the channel region defined by the pair of source/drain regions (such portion of the channel region also referred to as a floating gate electrode channel region); and (2) a control gate electrode positioned over the gate dielectric layer and covering a remainder portion of the channel region while at least partially covering and overlapping the floating gate electrode while being separated from the floating gate electrode by an inter-gate electrode dielectric layer (such remainder portion of the channel region also referred to as a control gate electrode channel region).

In order to effect operation of a split gate field effect transistor (FET) device, particular sets of voltages are applied to the control gate electrode, the source/drain regions and the semiconductor substrate in order to induce, reduce or sense charge within the floating gate electrode (which is otherwise fully electrically isolated) and thus provide conditions under which the floating gate electrode within the split gate field effect transistor (FET) device may be programmed, erased and/or read.

While split gate field effect transistor (FET) devices are thus desirable within the art of semiconductor integrated circuit microelectronic fabrication for providing semiconductor integrated circuit microelectronic fabrications with non-volatile data storage characteristics, split gate field effect transistor (FET) devices are nonetheless not entirely without problems in the art of semiconductor integrated circuit microelectronic fabrication.

In that regard, it is often difficult to form within non-volatile semiconductor integrated circuit microelectronic fabrications split gate field effect transistor (FET) devices with enhanced properties, and in particular with enhanced registration properties, such as but not limited to enhanced control gate electrode to floating gate electrode registration properties, within the split gate field effect transistor (FET) devices.

It is thus towards the goal of providing for use within semiconductor integrated circuit microelectronic fabrications, and in particular within semiconductor integrated circuit microelectronic memory fabrications, methods for fabricating split gate field effect transistor (FET) devices with enhanced properties, and in particular with enhanced registration properties, that the present invention is directed.

Various non-volatile semiconductor integrated circuit microelectronic devices having enhanced properties, such as but not limited to enhanced registration properties and enhanced alignment properties, and methods for fabrication thereof, have been disclosed within the art of non-volatile semiconductor integrated circuit microelectronic fabrication.

For example, Sung et al., in U.S. Pat. No. 5,940,706, disclose a method for fabricating within a split gate field effect transistor (FET) device a channel region within the split gate field effect transistor (FET) device, wherein the channel region within the split gate field effect transistor (FET) device is fabricated with enhanced location definition of the channel region within the split gate field effect transistor (FET) device and enhanced lateral size definition of the channel region within the split gate field effect transistor (FET) device. To realize the foregoing objects, there is employed when fabricating the split gate field effect transistor (FET) device a single composite mask layer, a series of patterned features of which are employed for defining both: (1) a floating gate electrode location and lateral size within the split gate field effect transistor (FET) device; and (2) a drain region location and lateral size with respect to the floating gate electrode location and lateral size within the split gate field effect transistor (FET) device.

In addition, Hsieh et al., in U.S. Pat. No. 6,017,795, disclose a method for fabricating a split gate field effect transistor (FET) device, as well as the split gate field effect transistor (FET) device fabricated in accord with the method, wherein there is provided within the split gate field effect transistor (FET) device an enhanced coupling ratio between a floating gate electrode within the split gate field effect transistor (FET) device and a source region within the split gate field effect transistor (FET) device. To realize the foregoing object, the method for fabricating the split gate field effect transistor (FET) device, and the split gate field effect transistor (FET) device resulting from the method, employ a source region partially topographically protruding with a sharp edge from a surface of a semiconductor substrate, in conjunction with a gate dielectric layer and a floating gate electrode formed conformally registered upon the sharp edge of the source region partially topographically protruding from the surface of the semiconductor substrate.

Desirable within the art of non-volatile semiconductor integrated circuit microelectronic fabrication, and in particular within the art of non-volatile semiconductor integrated circuit microelectronic memory fabrication, are additional methods and materials which may be employed for forming split gate field effect transistor (FET) devices with enhanced properties, and in particular with enhanced registration properties.

It is towards the foregoing object that the present invention is directed.

SUMMARY OF THE INVENTION

A first object of the present invention is to provide a method for fabricating, for use within a semiconductor integrated circuit microelectronic fabrication, a split gate field effect transistor (FET) device.

A second object of the present invention is to provide a method in accord with the first object of the present invention, wherein the split gate field effect transistor (FET) device is fabricated with enhanced properties.

A third object of the present invention is to provide a method in accord with the first object of the present invention and the second object of the present invention, wherein the method is readily commercially implemented.

In accord with the objects of the present invention, there is provided by the present invention a method for fabricating a split gate field effect transistor (FET) device, and a split gate field effect transistor (FET) device resulting from the method. To practice the method of the present invention, there is first provided a semiconductor substrate. There is then formed upon the semiconductor substrate a gate dielectric layer. There is then formed upon the gate dielectric layer a blanket floating gate electrode material layer. There is then formed upon the blanket floating gate electrode material layer a patterned mask layer. There is then etched, while employing the patterned mask layer as an etch mask layer, the blanket floating gate electrode material layer to form a floating gate electrode. There is then etched laterally, at least partially, the patterned mask layer to completely expose an edge of the floating gate electrode. There is then formed covering the floating gate electrode an inter-gate electrode dielectric layer. There is then formed upon the inter-gate electrode dielectric layer a control gate at least partially covering the floating gate electrode and at least partially not covering the floating gate electrode. Finally, there is also formed into the semiconductor substrate a pair of source/drain regions which define a floating gate electrode channel with respect to the floating gate electrode and an adjoining control gate electrode channel with respect to the control gate electrode.

The method of the present invention contemplates a split gate field effect transistor (FET) device fabricated in accord with the method of the present invention.

The present invention provides a method for fabricating within a semiconductor integrated circuit microelectronic fabrication, and in particular within a non-volatile semiconductor integrated circuit microelectronic memory fabrication, a split gate field effect transistor (FET) device, wherein the split gate field effect transistor (FET) device is fabricated with enhanced properties, and in particular with enhanced registration properties. The present invention realizes the foregoing objects by laterally etching, subsequent to forming a floating gate electrode by etching of a blanket floating gate electrode material layer while employing a mask layer, the mask layer to completely expose an edge of the floating gate electrode, prior to forming covering the floating gate electrode a blanket inter-gate electrode dielectric layer in turn having formed thereupon a control gate electrode. By completely exposing the edge of the floating gate electrode in such a fashion, there results an enhanced registration of the control gate electrode with respect to the floating gate electrode, and in particular with respect to the floating gate electrode edge, and consequently there also results enhanced erasing properties within the split gate field effect transistor (FET) device fabricated in accord with the present invention.

The method of the present invention is readily commercially implemented. A split gate field effect transistor (FET) device fabricated in accord with the present invention employs process steps and materials as are generally known in the art of semiconductor integrated circuit microelectronic fabrication, including but not limited to non-volatile semiconductor integrated circuit microelectronic memory fabrication, but employed within the context of a novel ordering and sequencing of process steps to provide a split gate field effect transistor (FET) device in accord with the present invention. Since it is thus a novel ordering and sequencing of process steps which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating within a semiconductor integrated circuit microelectronic fabrication, and in particular within a non-volatile semiconductor integrated circuit microelectronic memory fabrication, a split gate field effect transistor (FET) device, where the split gate field effect transistor (FET) device is fabricated with enhanced properties, and in particular with enhanced registration properties. The present invention realizes the foregoing objects by laterally etching, subsequent to forming a floating gate electrode by etching of a blanket floating gate electrode material layer while employing a mask layer, the mask layer to completely expose an edge of the floating gate electrode, prior to forming covering the floating gate electrode a blanket inter-gate electrode dielectric layer in turn having formed thereupon a control gate electrode. By completely exposing the edge of the floating gate electrode in such a fashion, there results an enhanced registration of the control gate electrode with respect to the floating gate electrode, and in particular with the floating gate electrode edge, and consequently there also results enhanced erasing properties within the split gate field effect transistor (FET) device.

A split gate field effect transistor (FET) device fabricated in accord with the present invention may be fabricated within a non-volatile semiconductor integrated circuit microelectronic fabrication such as but not limited to a non-volatile semiconductor integrated circuit microelectronic memory fabrication such as but not limited to an electrically erasable programmable read only memory (EEPROM) semiconductor integrated circuit microelectronic memory fabrication such as but not limited to a flash memory fabrication.

Referring now to FIG. 1 to FIG. 5, there is shown a series of schematic cross-sectional diagrams illustrating the results of progressive stages in forming within a semiconductor integrated circuit microelectronic fabrication, and in accord with a preferred embodiment of the present invention, a pair of split gate field effect transistor (FET) devices.

Figure 1:
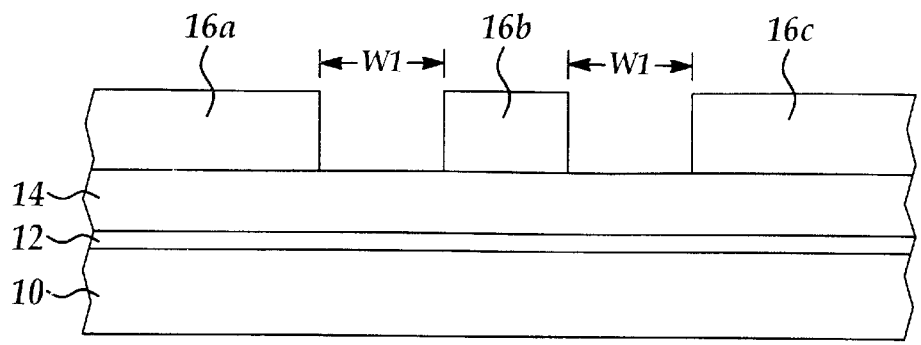
FIG. 1, FIG. 2, FIG. 3, FIG. 4 and FIG. 5 show a series of schematic cross-sectional diagrams illustrating the results of progressive stages of fabricating within a semiconductor integrated circuit microelectronic fabrication, and in accord with a preferred embodiment of the present invention, a pair of split gate field effect transistor (FET) devices.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed thereupon a blanket gate dielectric layer 12, in turn having formed thereupon a blanket floating gate electrode material layer 14, in turn having formed thereupon a series of patterned mask layers 16a, 16b and 16c.

Within the preferred embodiment of the present invention with respect to the semiconductor substrate 10, although it is known in the art of semiconductor integrated circuit microelectronic fabrication that semiconductor substrates may be formed with either dopant polarity, several dopant concentrations and various crystallographic orientations, for the preferred embodiment of the present invention, the semiconductor substrate 10 is typically and preferably a (100) silicon semiconductor substrate having an N- or (preferably) a P- doping of sufficient concentration to impart a bulk resistivity of from about 8 to about 12 ohm-cm to the semiconductor substrate 10.

Similarly, within the preferred embodiment of the present invention with respect to the blanket gate dielectric layer 12, although it is also known in the art of semiconductor integrated circuit microelectronic fabrication that gate dielectric layers may be formed employing methods including but not limited to gate dielectric layer thermal growth methods and gate dielectric layer deposition/patterning methods, for the preferred embodiment of the present invention, the blanket gate dielectric layer 12 is typically and preferably formed employing a gate dielectric layer thermal growth method at a temperature of form about 800 to about 1100 degrees centigrade to form the blanket gate dielectric layer 12 of silicon oxide of thickness from about 50 to about 100 angstroms formed upon the semiconductor substrate 10.

Similarly, within the preferred embodiment of the present invention with respect to the blanket floating gate electrode material layer 14, although it is known in the art of semiconductor integrated circuit microelectronic fabrication, including in particular semiconductor integrated circuit microelectronic memory fabrication, that floating gate electrodes may be formed of conductor materials including but not limited to metal, metal alloy, doped polysilicon (having a dopant concentration of greater than about 1E18 dopant atoms per cubic centimeter) and polycide (doped polysilicon/metal silicide stack) conductor materials, for the preferred embodiment of the present invention, the blanket gate electrode material layer 14 is typically and preferably formed employing a doped polysilicon conductor material formed to a thickness of from about 500 to about 1000 angstroms upon the blanket gate dielectric layer 12.

Finally, within the preferred embodiment of the present invention with respect to the series of patterned mask layers 16a, 16b and 16c, although it is known in the art of semiconductor integrated circuit microelectronic fabrication that patterned mask layers may be formed from mask materials including but not limited to photoresist mask materials and hard mask materials, for the preferred embodiment of the present invention, and in order to facilitate processing of the pair of split gate field effect transistor (FET) devices derived incident to further processing of the semiconductor integrated circuit microelectronic fabrication whose schematic cross-sectional diagram is illustrated in FIG. 1, the series of patterned mask layers 16a, 16b and 16c is typically and preferably formed of a silicon nitride hard mask material as may be formed employing methods including but not limited to chemical vapor deposition (CVD) methods, plasma enhanced chemical vapor deposition (PECVD) methods and physical vapor deposition (PVD) sputtering methods. Typically and preferably, the series of patterned mask layers 16a, 16b and 16c formed of the silicon nitride hard mask material is formed to a thickness of from about 1000 to about 3000 angstroms each. As is similarly also illustrated within the schematic cross-sectional diagram of FIG. 1, the series of patterned mask layers 16a, 16b and 16c defines a pair of apertures of bidirectional (i.e., areal) aperture width W1 from about 0.15 to about 0.3 microns, further wherein the pair of apertures is employed in part in defining a pair of floating gate electrodes within the pair of split gate field effect transistor (FET) devices formed incident to further fabrication of the semiconductor integrated circuit microelectronic fabrication whose schematic cross-sectional diagram is illustrated in FIG. 1.

Figure 2:
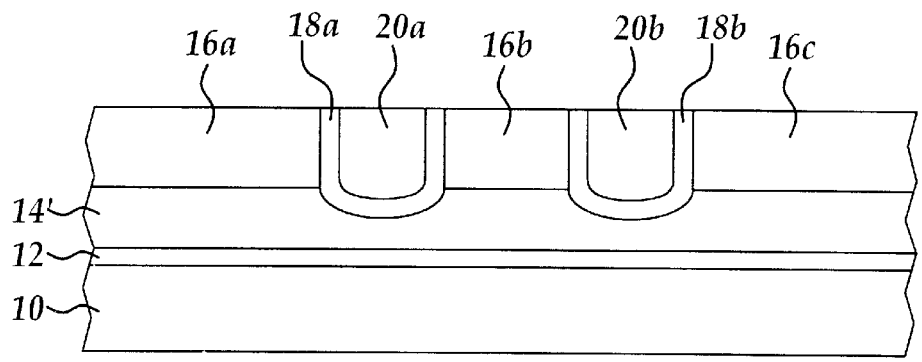

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, the blanket gate electrode material layer 14 has been partially etched to form a partially etched blanket gate electrode material layer 14', while employing the series of patterned mask layers 16a, 16b and 16c as an etch mask layer.

Within the preferred embodiment of the present invention, and as is illustrated within the schematic cross-sectional diagram of FIG. 2, the blanket floating gate electrode material layer 14 is etched to form the partially etched blanket floating gate electrode material layer 14' while employing an isotropic etchant, such as to provide a pair of concavities within the partially etched blanket floating gate electrode material layer 14' at the location of the pair of apertures defined by the series of patterned mask layers 16a, 16b and 16c. Typically and preferably, when the blanket floating gate electrode material layer 14 is formed of a polysilicon material, the isotropic etchant is an aqueous solution mixture of hydrofluoric acid and acetic acid, employed in a composition and under conditions such as to etch a maximum depth of from about 200 to about 500 angstroms when forming the pair of concavities within the partially etched blanket floating gate electrode material layer 14'.

Shown also within the schematic cross-sectional diagram of FIG. 2, and formed into the pair of apertures defined by the series of patterned mask layers 16a, 16b and 16c is a pair of patterned planarized conformal sacrificial dielectric layers 18a and 18b in turn having formed thereupon a pair of patterned planarized non-sacrificial dielectric layers 20a and 20b, wherein, as will be discussed further below, the pair of patterned planarized conformal sacrificial dielectric layers 18a and 18b and the pair of patterned planarized non-sacrificial dielectric layers 20a and 20b are employed in part as an etch mask layer for forming a pair of floating gate electrodes from the partially etched blanket floating gate electrode material layer 14'.

Within the preferred embodiment of the present invention with respect to the pair of patterned planarized conformal sacrificial dielectric layers 18a and 18b and the pair of patterned planarized non-sacrificial dielectric layers 20a and 20b, and as is understood by a person skilled in the art, the pair of patterned planarized conformal sacrificial dielectric layers 18a and 18b is formed of a dielectric material which is more susceptible to etching within an etchant than the pair of patterned planarized non-sacrificial dielectric layers 20a and 20b is susceptible to etching within the etchant. Thus, within the context of the present invention, a pair of materials from which is formed the pair of patterned planarized conformal sacrificial dielectric layers 18a and 18b and the pair of patterned planarized non-sacrificial dielectric layers 20a and 20b is selected within the context of an appropriate etchant which provides the foregoing etchant selectivity, as is desirable within the context of the present invention and the preferred embodiment of the present invention.

Thus, although several combinations of dielectric materials and etchants are plausible within the context of the present invention and the preferred embodiment of the present invention, for the preferred embodiment of the present invention, the pair of patterned planarized conformal sacrificial dielectric layers 18a and 18b is typically and preferably formed of a comparatively less dense silicon oxide dielectric material which may be formed employing thermal chemical vapor deposition (CVD) methods as are generally known in the art of semiconductor integrated circuit microelectronic fabrication, while the pair of patterned planarized non-sacrificial dielectric layers 20a and 20b is typically and preferably formed of a comparatively more dense silicon oxide dielectric material which may be formed employing a high density plasma chemical vapor deposition (HDP-CVD) method as is otherwise generally known in the art of semiconductor integrated circuit microelectronic fabrication. Typically and preferably, the pair of patterned planarized conformal sacrificial dielectric layers 18a and 18b is formed from a blanket conformal sacrificial dielectric layer formed to a thickness of from about 100 to about 300 angstroms and the pair of patterned planarized non-sacrificial dielectric layers 20a and 20b is formed from a corresponding blanket non-sacrificial dielectric layer formed to a thickness of from about 2000 to about 5000 angstroms, where the blanket conformal sacrificial dielectric layer and the blanket non-sacrificial dielectric layer are sequentially patterned and planarized while employing a planarizing method, typically and preferably a chemical mechanical polish (CMP) planarizing method.

Figure 3:
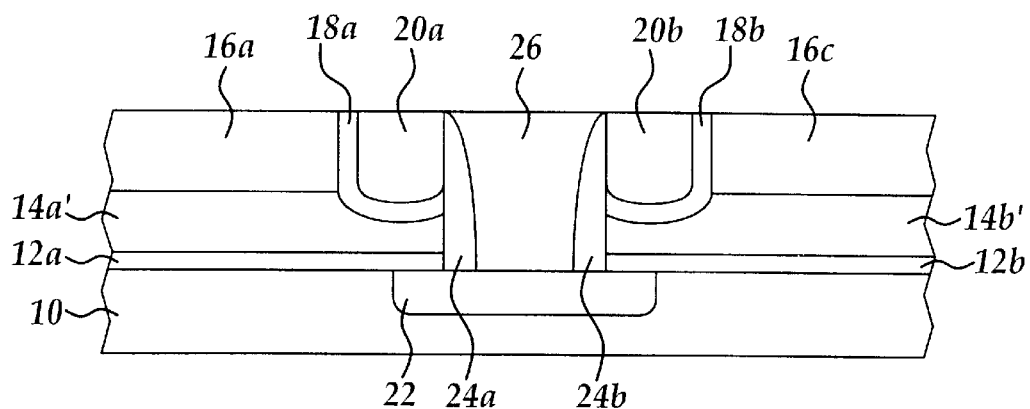

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance: (1) the patterned silicon nitride hard mask layer 16b has been stripped from the semiconductor integrated circuit microelectronic fabrication; (2) a pair of portions of the patterned planarized conformal sacrificial dielectric layers 18a and 18b has been stripped from the semiconductor integrated circuit microelectronic fabrication to form a pair of singly etched patterned planarized conformal sacrificial dielectric layers 18a' and 18b' while leaving exposed a pair of sidewalls of the pair of patterned planarized non-sacrificial dielectric layers 20a and 20b; and (3) the pair of patterned planarized non-sacrificial dielectric layers 20a and 20b is employed as an etch mask for forming from the partially etched blanket floating gate electrode material layer 14' a pair of partially etched patterned floating gate electrode material layers 14a' and 14b' and forming from the blanket gate dielectric layer 12 a pair of patterned gate dielectric layers 12a and 12b.

Within the preferred embodiment of the present invention, the patterned mask layer 16b when formed of a silicon nitride hard mask material may be selectively stripped from the semiconductor integrated circuit microelectronic fabrication whose schematic cross-sectional diagram is illustrated in FIG. 2 to provide in part the semiconductor integrated circuit microelectronic fabrication whose schematic cross-sectional diagram is illustrated in FIG. 3 while first appropriately masking adjacent portions of the semiconductor integrated circuit microelectronic fabrication, typically and preferably with an appropriate photoresist mask layer (not shown), and then employing an aqueous phosphoric acid etchant for stripping the patterned mask layer 16b when formed of the silicon nitride hard mask material, although other etchants may also be employed. Similarly, exposed portions of the pair of patterned planarized conformal sacrificial dielectric layers 18a and 18b may then be etched to form the pair of singly etched patterned planarized conformal sacrificial dielectric layers 18a' and 18b' while employing an etchant, such as but not limited to a dilute hydrofluoric acid etchant, having the above defined specificity for the material from which is formed the pair of patterned planarized conformal sacrificial dielectric layers 18a and 18b with respect to the material from which is formed the pair of patterned planarized non-sacrificial dielectric layers 20a and 20b. Finally, within the preferred embodiment of the present invention, with respect to forming from the partially etched blanket floating gate electrode material layer 14' the pair of partially etched patterned floating gate electrode material layers 14a' and 14b', and forming from the blanket gate dielectric layer 12 the pair of patterned gate dielectric layers 12a and 12b, the pair of partially etched patterned floating gate electrode material layers 14a' and 14b' is typically and preferably formed from the partially etched blanket floating gate electrode material layer 14' and the pair of patterned gate dielectric layers 12a and 12b is typically and preferably formed from the blanket gate dielectric layer 12 while employing a sequential anisotropic plasma etch method as is otherwise generally conventional in the art of semiconductor integrated circuit microelectronic fabrication, wherein such a sequential anisotropic plasma etch method typically and preferably employs a chlorine containing etchant gas composition for forming the pair of partially etched patterned floating gate electrode material layers 14a' and 14b' and a fluorine containing etchant gas composition for forming the pair of patterned gate dielectric layers 12a and 12b.

Shown also within the schematic cross-sectional diagram of FIG. 3 is: (1) a source region 22 formed within a portion of the semiconductor substrate 10 exposed at the bottom of an aperture defined by the pair of patterned gate dielectric layers 12a and 12b, the pair of partially etched patterned floating gate electrode material layers 14a' and 14b', the pair of singly etched patterned planarized conformal sacrificial dielectric layers 18a' and 18b' and the pair of patterned planarized non-sacrificial dielectric layers 20a and 20b; (2) a pair of self aligned dielectric spacer layers 24a and 24b formed upon a pair of sidewalls of the aperture defined by the pair of patterned gate dielectric layers 12a and 12b, the pair of partially etched patterned floating gate electrode material layers 14a' and 14b', the pair of singly etched patterned planarized conformal sacrificial dielectric layers 18a' and 18b' and the pair of patterned planarized non-sacrificial dielectric layers 20a and 20b; and (3) a conductor contact stud 26 formed upon the pair of self aligned spacer layers 24a and 24b and completely filling the aperture.

Within the preferred embodiment of the present invention, the source region 22 may be formed employing ion implantation and thermal annealing methods as are otherwise generally conventional in the art of semiconductor integrated circuit microelectronic fabrication, wherein such ion implantation methods typically and preferably employ a relatively high thermal diffusivity implanted dopant ion (such as but not limited to phosphorus in comparison with arsenic), employed at an ion implantation dose of from about $10^{13}$ to about $10^{15}$ dopant ions per square centimeter and an ion implantation energy of from about 20 to about 80 keV, in order to provide for effective diffusion of the source region 22 beneath the pair of patterned partially etched floating gate electrode material layers 14a' and 14b'.

Similarly, within the preferred embodiment of the present invention with respect to the pair of dielectric spacer layers 24a and 24b, the pair of dielectric spacer layers 24a and 24b may similarly also be formed employing self-aligned methods as are conventional in the art of semiconductor integrated circuit microelectronic fabrication, including but not limited to self-aligned anisotropic etching methods which typically and preferably provide the pair of dielectric spacer layers 24a and 24b formed of a silicon nitride dielectric material.

Finally, within the preferred embodiment of the present invention with respect to the conductor contact stud 26, although the conductor contact stud 26 may be formed employing any of several materials as are conventional in the art of semiconductor integrated circuit microelectronic fabrication, including but not limited to metal, metal alloy, doped polysilicon and polycide conductor materials, for the preferred embodiment of the present invention, the conductor contact stud 26 is typically and preferably formed of a doped polysilicon conductor material formed and subsequently chemical mechanical polish (CMP) planarized to form the conductor contact stud 26.

Figure 4:
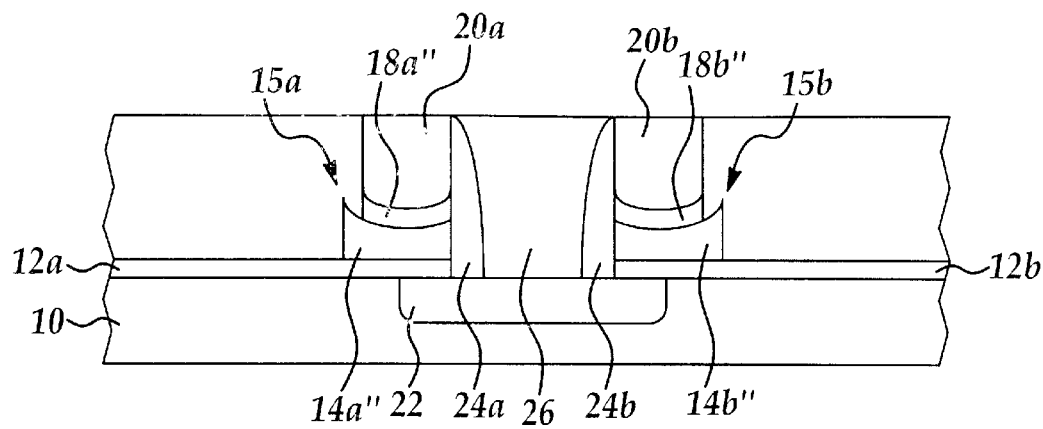

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein: (1) the pair of patterned mask layers 16a and 16c has been stripped from the semiconductor integrated circuit microelectronic fabrication; (2) the pair of partially etched patterned floating gate electrode material layers 14a' and 14b' has been further etched to form a pair of floating gate electrodes 14a" and 14b" while employing as a mask the pair of singly etched patterned planarized conformal sacrificial dielectric layers 18a' and 18b' and the corresponding pair of patterned planarized non-sacrificial dielectric layers 20a and 20b; and then (3) the pair of singly etched patterned planarized conformal sacrificial dielectric layers 18a' and 18b' is further etched to form a pair of doubly etched patterned planarized conformal sacrificial dielectric layers 18a" and 18b" which in turn leaves fully exposed a pair of edges 15a and 15b of the pair of floating gate electrodes 14a" and 14b". By leaving "fully exposed" the pair of edges 15a and 15b of the pair of floating gate electrodes 14a" and 14b", it is intended within the context of the present invention that there exposed at least portions of both surfaces of the pair of floating gate electrodes 14a" and 14b" which lead up to the pair of edges 15a and 15b of the pair of floating gate electrodes 14a" and 14b".

Within the preferred embodiment of the present invention, the pair of patterned mask layers 16a and 16c may be stripped from the semiconductor integrated circuit microelectronic fabrication whose schematic cross-sectional diagram is illustrated in FIG. 3 to provide in part the semiconductor integrated circuit microelectronic fabrication whose schematic cross-sectional diagram is illustrated in FIG. 4 while employing stripping methods and materials analogous or equivalent to the stripping methods and materials employed for stripping from the semiconductor integrated circuit microelectronic fabrication whose schematic cross-sectional diagram is illustrated in FIG. 2 the patterned mask layer 16b when forming in part the semiconductor integrated circuit microelectronic fabrication whose schematic cross-sectional diagram is illustrated in FIG. 3.

Similarly, within the preferred embodiment of the present invention, the pair of partially etched patterned floating gate electrode material layers 14a' and 14b' as illustrated within the schematic cross-sectional diagram of FIG. 3 may be further etched to form the pair of floating gate electrodes 14a" and 14b" as illustrated within the schematic cross-sectional diagram of FIG. 4 while employing etch methods analogous or equivalent to the etch methods as are employed for forming from the partially etched blanket floating gate electrode material layer 14' as illustrated within the schematic cross-sectional diagram of FIG. 2 the pair of partially etched patterned floating gate electrode material layers 14a' and 14b' as illustrated within the schematic cross-sectional diagram of FIG. 3.

Finally, within the preferred embodiment of the present invention, the pair of singly etched patterned planarized conformal sacrificial dielectric layers 18a' and 18b' as illustrated within the schematic cross-sectional diagram of FIG. 3 may be further etched to form the pair of doubly etched patterned planarized conformal sacrificial dielectric layers 18a" and 18b" as illustrated within the schematic cross-sectional diagram of FIG. 4 while employing methods and materials analogous or equivalent to the methods and materials employed for forming from the pair of patterned planarized conformal sacrificial dielectric layers 18a and 18b as illustrated within the schematic cross-sectional diagram of FIG. 2 the pair of singly etched patterned planarized conformal sacrificial dielectric layers 18a' and 18b' as illustrated within the schematic cross-sectional diagram of FIG. 3.

As is understood by a person skilled in the art, the series of process steps employed in forming from the semiconductor integrated circuit microelectronic fabrication whose schematic cross-sectional diagram is illustrated in FIG. 3 the semiconductor integrated circuit microelectronic fabrication whose schematic cross-sectional diagram is illustrated in FIG. 4 is generally analogous but nonetheless noticeably different from the series of process steps employed for forming from the semiconductor integrated circuit microelectronic fabrication whose schematic cross-sectional diagram is illustrated in FIG. 2 the semiconductor integrated circuit microelectronic fabrication whose schematic cross-sectional diagram is illustrated in FIG. 3. In that regard, and in particular within the context of the preferred embodiment of the present invention, the series of process steps which leads to the semiconductor integrated circuit microelectronic fabrication whose schematic cross-sectional diagram is illustrated in FIG. 4 provides for fully exposing (by at least about 100 angstroms and more preferably from about 200 to about 400 angstroms) within the pair of floating gate electrodes 14a" and 14b" the pair of outboard floating gate electrode edges 15a and 15b within the pair of floating gate electrodes 14a" and 14b" which will subsequently be covered by a pair of control gate electrodes. Such complete exposure of the pair of floating gate electrode edges 15a and 15b similarly also provides within the context of the present invention for enhanced registration of the pair of control gate electrodes with the pair of floating gate electrodes 14a" and 14b", and similarly thus also provides for enhanced properties, and in particular for enhanced erasing speed properties, within a pair of split gate field effect transistor (FET) devices which result from further processing of the semiconductor integrated circuit microelectronic fabrication whose schematic cross-sectional diagram is illustrated in FIG. 4.

As is further understood by a person skilled in the art, the processing sequence which is employed for fabricating the semiconductor integrated circuit microelectronic fabrication whose schematic cross-sectional diagram is illustrated in FIG. 3 from the semiconductor integrated circuit microelectronic fabrication whose schematic cross-sectional diagram is illustrated in FIG. 2 may more closely parallel the processing sequence which is employed for fabricating the semiconductor integrated circuit microelectronic fabrication whose schematic cross-sectional diagram is illustrated in FIG. 4 from the semiconductor integrated circuit microelectronic fabrication whose schematic cross-sectional diagram is illustrated in FIG. 3, while still providing a functional semiconductor integrated circuit microelectronic fabrication, although the processing sequence employed for fabricating the semiconductor integrated circuit microelectronic fabrication whose schematic cross-sectional diagram is illustrated in FIG. 3 from the semiconductor integrated circuit microelectronic fabrication whose schematic cross-sectional diagram is illustrated in FIG. 2 provides for a more limited semiconductor integrated circuit microelectronic fabrication feature size, in particular with respect to the pair of floating gate electrodes 14a" and 14b".

Similarly, as is yet further understood by a person skilled in the art, it is also feasible within the context of the present invention to completely strip the patterned planarized non-sacrificial dielectric layers 20a and 20b and the pair of singly etched patterned planarized conformal sacrificial dielectric layers 18a' and 18b' from the semiconductor integrated circuit microelectronic fabrication whose schematic cross-sectional diagram is illustrated in FIG. 3 after they have been employed as an aggregate mask for forming the pair of floating gate electrodes 14a" and 14b", prior to further processing of the semiconductor integrated circuit microelectronic fabrication whose schematic cross-sectional diagram is illustrated in FIG. 4, however, such processing is not preferred within the context of the present invention and the preferred embodiment of the present invention insofar as the present invention and the preferred embodiment of the present invention provide for a controlled exposure of a pair of edges 15a and 15b of a pair of floating gate electrodes 14a" and 14b", and thus enhanced and controlled properties within a pair of split gate field effect transistor (FET) devices in accord with the preferred embodiment of the present invention.

Figure 5:
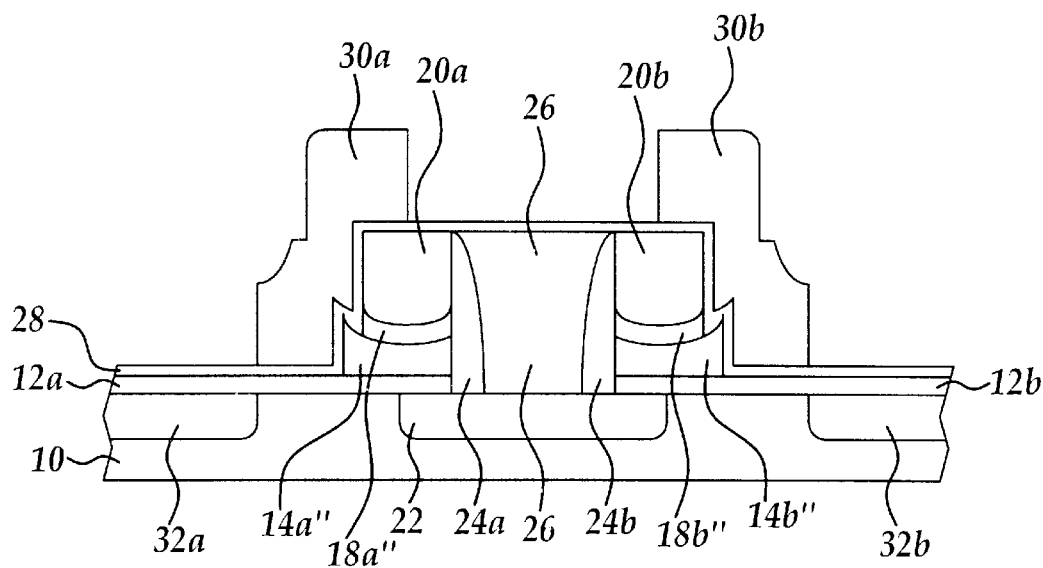

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein, in a first instance, there is formed covering the structures within the semiconductor integrated circuit microelectronic fabrication whose schematic cross-sectional diagram is illustrated in FIG. 4, and in particular the exposed surfaces of the pair of floating gate electrodes 14a" and 14b" and the pair of edges 15a and 15b of the pair of floating gate electrodes 14a" and 14b", a blanket conformal inter-gate electrode dielectric layer 28.

Within the preferred embodiment of the present invention, the blanket conformal inter-gate electrode dielectric layer 28 may be formed employing methods and dielectric materials as are conventional in the art of semiconductor integrated circuit microelectronic fabrication, which will typically and preferably include an aggregate of thermal growth methods and chemical vapor deposition (CVD) methods to form the blanket conformal inter-gate electrode dielectric layer 28 at least in part of a silicon oxide inter-gate electrode dielectric material. Typically and preferably, the blanket conformal inter-gate electrode dielectric layer 28 is formed to a thickness of from about 100 to about 300 angstroms.

There is also shown within the schematic cross-sectional diagram of FIG. 5 formed upon the blanket conformal inter-gate electrode dielectric layer 28 and at least partially covering the floating gate electrodes 14a" and 14b" and at least partially not covering the pair of floating gate electrodes 14a" and 14b" a pair of control gate electrodes 30a and 30b.

The pair of floating gate electrodes 30a and 30b as illustrated within the schematic cross-sectional diagram of FIG. 5 may be formed employing methods and control gate electrode materials as are conventional in the art of semiconductor integrated circuit microelectronic fabrication. Typically and preferably, the pair of control gate electrodes 30a and 30b is formed of a polysilicon floating gate electrode material, formed to a thickness of from about 1000 to about 3000 angstroms.

Finally, there is also shown within the schematic cross-sectional diagram of FIG. 5 formed into the semiconductor substrate 10 adjacent a pair of edges of the pair of control gate electrodes 30a and 30b and extending away from the source region 22 a pair of drain regions 32a and 32b.

Within the preferred embodiment of the present invention, the pair of drain regions 32a and 32b may be formed employing methods and materials as are conventional in the art of semiconductor integrated circuit microelectronic fabrication, which will typically and preferably employ an ion implantation method employing an implanting ion of polarity equivalent the polarity of the source region, but with a reduced thermal diffusivity (i.e., such as but not limited to arsenic in comparison with phosphorus), such as to such as to define interposed between the pair of drain regions 32a and 32b with respect to the source region 22 a pair of floating gate electrode channel regions (over which are formed portions of the floating gate electrodes 14a" and 14b") with respect to the pair of floating gate electrodes 14a" and 14b" adjoining a pair of control gate electrode channel regions (comprising remainder portions of the channel regions) with respect to the pair of control gate electrodes 30a and 30b.

Upon forming the semiconductor integrated circuit microelectronic fabrication whose schematic cross-sectional diagram is illustrated in FIG. 5, there is formed within the context of the present invention and preferred embodiment of the present invention a semiconductor integrated circuit microelectronic fabrication having formed therein a pair of split gate field effect transistor (FET) devices with enhanced control gate electrode to floating gate electrode registration. The pair of split gate field effect transistor (FET) devices exhibits the enhanced control gate electrode to floating gate electrode registration by at least partially laterally etching a pair of mask layers employed for forming a pair of floating gate electrodes from over the pair of floating gate electrodes to completely expose a pair of floating gate electrode edges prior to forming over the pair of floating gate electrode electrodes and the pair of floating gate electrode edges a blanket conformal inter-gate electrode dielectric layer in turn having formed thereupon a pair of control gate electrodes.

As is understood by a person skilled in the art, the preferred embodiment of the present invention is illustrative of the present invention rather than limiting of the present invention. Revisions and modifications may be made to methods, materials, structures and dimensions employed for fabricating a split gate field effect transistor (FET) device in accord with the preferred embodiment of the present invention while still providing a split gate field effect transistor (FET) device fabricated in accord with the present invention, further in accord with the accompanying claims.

What is claimed is:

1. A method for fabricating a split gate field effect transistor comprising:
   providing a semiconductor substrate;
   forming upon the semiconductor substrate a gate dielectric layer;
   forming upon the gate dielectric layer a blanket floating gate electrode material layer;
   forming upon the blanket floating gate electrode material layer a patterned mask layer;
   etching, while employing the patterned mask layer as an etch mask layer, the blanket floating gate electrode material layer to form a floating gate electrode;
   etching laterally, at least partially, the patterned mask layer to fully expose an edge of the floating gate electrode;
   covering covering the floating gate electrode and the edge of the floating gate electrode with an inter-gate electrode dielectric layer;
   forming upon the inter-gate electrode dielectric layer a control gate electrode at least partially covering the floating gate electrode; and
   forming into the semiconductor substrate a pair of source/drain regions which define a floating gate electrode channel with respect to the floating gate electrode and an adjoining control gate electrode channel with respect to the control gate electrode.

2. The method of claim 1 wherein the gate dielectric layer is formed to a thickness of from about 50 to about 110 angstroms.

3. The method of claim 1 wherein the blanket floating gate electrode material layer is formed to a thickness of from about 500 to about 1000 angstroms.

4. The method of claim 1 wherein the patterned mask layer is formed to a thickness of from about 1000 to about 3000 angstroms.

5. A method for fabricating a split gate field effect transistor comprising:
   providing a semiconductor substrate;
   forming upon the semiconductor substrate a gate dielectric layer;
   forming upon the gate dielectric layer a blanket floating gate electrode material layer;
   forming upon the blanket floating gate electrode material layer a patterned mask layer;
   etching, while employing the patterned mask layer as an etch mask layer, the blanket floating gate electrode material layer to form a floating gate electrode;
   etching laterally, at least partially, the patterned mask layer to fully expose an edge of the floating gate electrode;
   covering covering the floating gate electrode with and the edge of the floating gate electrode an inter-gate electrode dielectric layer;
   forming upon the inter-gate electrode dielectric layer a control gate electrode at least partially covering the floating gate electrode; and
   forming into the semiconductor substrate a pair of source/drain regions which define a floating gate electrode channel with respect to the floating gate electrode and an adjoining control gate electrode channel with respect to the control gate electrode;
   wherein the patterned mask layer comprises at minimum:
      a laterally laminated sacrificial layer which is laterally etched to fully expose the edge of the floating gate electrode; and
      a laterally laminated non-sacrificial layer which is not laterally etched to fully expose the edge of the floating gate electrode.

6. The method of claim 1 wherein the floating gate electrode is formed with a concave upper surface.

7. The method of claim 1 wherein the inter-gate electrode dielectric layer is formed to a thickness of from about 100 to about 300 angstroms.

8. The method of claim 1 wherein the control gate electrode is formed to a thickness of from about 1000 to about 3000 angstroms.

* * * * *